(12) United States Patent
El-Ibiary et al.

(10) Patent No.: US 7,164,243 B2
(45) Date of Patent: Jan. 16, 2007

(54) SYSTEM AND METHOD FOR ESTABLISHING MOTOR EFFICIENCY DURING BALANCED OR UNBALANCED OPERATING CONDITIONS

(75) Inventors: Yehia El-Ibiary, Simpsonville, SC (US); Roger H. Daugherty, Simpsonville, SC (US)

(73) Assignee: Reliance Electric Technologies, LLC, Mayfield Heights, OH (US)

( * ) Notice: Subject to any disclaimer, the term of this patent is extended or adjusted under 35 U.S.C. 154(b) by 106 days.

(21) Appl. No.: 10/675,312

(22) Filed: Sep. 30, 2003

(65) Prior Publication Data

US 2005/0067992 A1    Mar. 31, 2005

(51) Int. Cl.
G01R 31/00    (2006.01)
G06F 19/00    (2006.01)

(52) U.S. Cl. .................. 318/254; 318/798; 702/60; 702/58; 324/76.24; 324/772

(58) Field of Classification Search ............... 318/471, 318/473, 727, 729, 767, 798, 799, 802, 804, 318/805, 812, 254; 702/115, 126, 57–60; 324/545, 546, 59, 772
See application file for complete search history.

(56) References Cited

U.S. PATENT DOCUMENTS

| | | | | |
|---|---|---|---|---|
| 4,851,782 A | * | 7/1989 | Jeerings et al. | 324/520 |
| 5,345,158 A | | 9/1994 | Kliman et al. | 318/434 |
| 5,378,979 A | * | 1/1995 | Lombardi | 324/107 |
| 5,477,163 A | * | 12/1995 | Kliman | 318/434 |
| 5,514,978 A | * | 5/1996 | Koegl et al. | 318/690 |
| 5,786,708 A | * | 7/1998 | Premerlani et al. | 324/772 |
| 5,839,093 A | * | 11/1998 | Novosel et al. | 702/59 |
| 5,969,498 A | * | 10/1999 | Cooke | 318/799 |
| 6,042,265 A | | 3/2000 | Kliman et al. | 374/152 |
| 6,064,172 A | * | 5/2000 | Kuznetsov | 318/716 |
| 6,141,196 A | * | 10/2000 | Premerlani et al. | 361/78 |
| 6,236,947 B1 | * | 5/2001 | Dowling et al. | 702/38 |
| 6,308,140 B1 | * | 10/2001 | Dowling et al. | 702/60 |
| 6,571,182 B1 | * | 5/2003 | Adamiak et al. | 702/64 |
| 6,611,771 B1 | * | 8/2003 | Habetler et al. | 702/58 |
| 6,636,823 B1 | * | 10/2003 | Unsworth et al. | 702/115 |
| 6,831,440 B1 | * | 12/2004 | Royak et al. | 318/727 |
| 2002/0053894 A1 | | 5/2002 | Shishkin et al. | 318/727 |
| 2005/0027464 A1 | * | 2/2005 | Jonker et al. | 702/61 |

OTHER PUBLICATIONS

Fundamentals of Electric Drives, Mohamed A. El-Sharkawi, University of Washington.

* cited by examiner

*Primary Examiner*—Lincoln Donovan
*Assistant Examiner*—Eduardo Colon Santana
(74) *Attorney, Agent, or Firm*—Patrick S. Yoder; Alexander M. Gerasimow (57) ABSTRACT

A system and method for establishing a plurality of operating parameters of a multiphase motor. The plurality of electrical parameters may be established from stator resistance data and electrical input data. The system and method may be used to decompose the electrical input data into a positive sequence and a negative sequence. The positive sequence may be used to establish a plurality of electrical parameters of the motor. The plurality of electrical parameters may be used with the positive sequence and negative sequence to establish the output power of the motor.

36 Claims, 5 Drawing Sheets

SYSTEM AND METHOD FOR ESTABLISHING MOTOR EFFICIENCY DURING BALANCED OR UNBALANCED OPERATING CONDITIONS

BACKGROUND OF THE INVENTION

1. Field of the Invention

The present invention relates generally to the field of electric motors. More particularly, the invention relates to a novel technique for establishing the efficiency of a motor under either balanced or unbalanced operating conditions.

2. Description of the Related Art

A wide variety of induction motors are available and are currently in use throughout a range of industrial applications. In general, such motors include a stator provided in a motor housing and a rotor surrounded at least partially by the stator and supported for rotation within the housing. The stator and rotor may be mechanically and electrically configured in a variety of manners depending upon a number of factors, including: the application, the power available to drive the motor, and so forth. In general, however, electric power is applied to the stator to produce a rotating magnetic field to drive the rotor in rotation. Mechanical power is transmitted from the motor via an output shaft coupled to the rotor.

In many industrial applications, induction motors are powered by three-phase alternating current. When the three-phase alternating voltage is balanced, the three phases have approximately the same maximum values for the voltage and current. However, the three-phase alternating voltage supplied to a motor may be unbalanced. An unbalanced operating condition may be caused by single-phase loads connected one or more of the three phases. When the three-phase alternating current is unbalanced, the three phases will not have the same maximum values of voltage and current. This unbalanced condition causes additional losses in the motor. As a result, a motor operated in an unbalanced condition is not as efficient as a motor operated in a balanced condition.

Typically, it is desired to know the efficiency at which a motor is being operated. However, there is no current technique that enables the efficiency of a motor to be established when the motor is operated in an unbalanced condition. A need exists for a technique to enable the efficiency of a motor operated in an unbalanced condition to be established

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Figure 1:
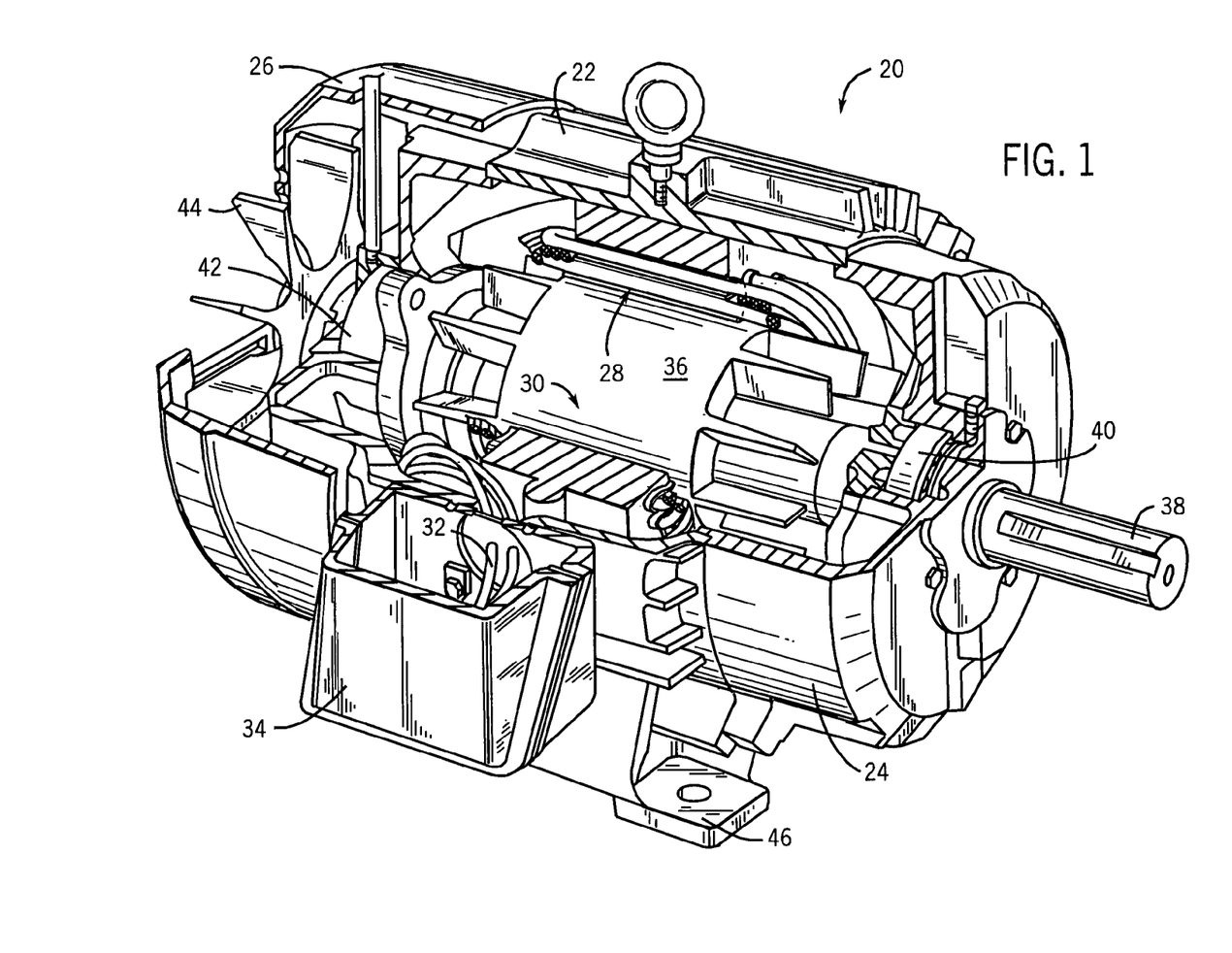
FIG. 1 is a perspective view of an electric motor illustrating the various functional components of the motor including a rotor and a stator, in accordance with certain aspects of the invention.

Turning now to the drawings, and referring first to FIG. 1, an electric motor is shown and designated generally by the reference numeral 20. In the embodiment illustrated in FIG. 1, motor 20 is an induction motor housed in an enclosure. Accordingly, motor 20 includes a frame 22 open at front and rear ends and capped by a front end cap 24 and a rear end cap 26. The frame 22, front end cap 24, and rear end cap 26 form a protective shell, or housing, for a stator assembly 28 and a rotor assembly 30. Stator windings are electrically interconnected to form groups, and the groups are, in turn, interconnected. The windings are further coupled to terminal leads 32. The terminal leads 32 are used to electrically connect the stator windings to an external power cable (not shown) coupled to a source of electrical power. Energizing the stator windings produces a magnetic field that induces rotation of the rotor assembly 30. The electrical connection between the terminal leads and the power cable is housed within a conduit box 34.

In the embodiment illustrated, rotor assembly 30 comprises a cast rotor 36 supported on a rotary shaft 38. As will be appreciated by those skilled in the art, shaft 38 is configured for coupling to a driven machine element (not shown), for transmitting torque to the machine element. Rotor 36 and shaft 38 are supported for rotation within frame 22 by a front bearing set 40 and a rear bearing set 42 carried by front end cap 24 and rear end cap 26, respectively. In the illustrated embodiment of electric motor 20, a cooling fan 44 is supported for rotation on shaft 38 to promote convective heat transfer through the frame 22. The frame 22 generally includes features permitting it to be mounted in a desired application, such as integral mounting feet 46. As will be appreciated by those skilled in the art, however, a wide variety of rotor configurations may be envisaged in motors that may employ the techniques outlined herein, including wound rotors of the type shown, and so forth. Similarly, the present technique may be applied to a variety of motor types having different frame designs, mounting and cooling styles, and so forth.

Figure 2:
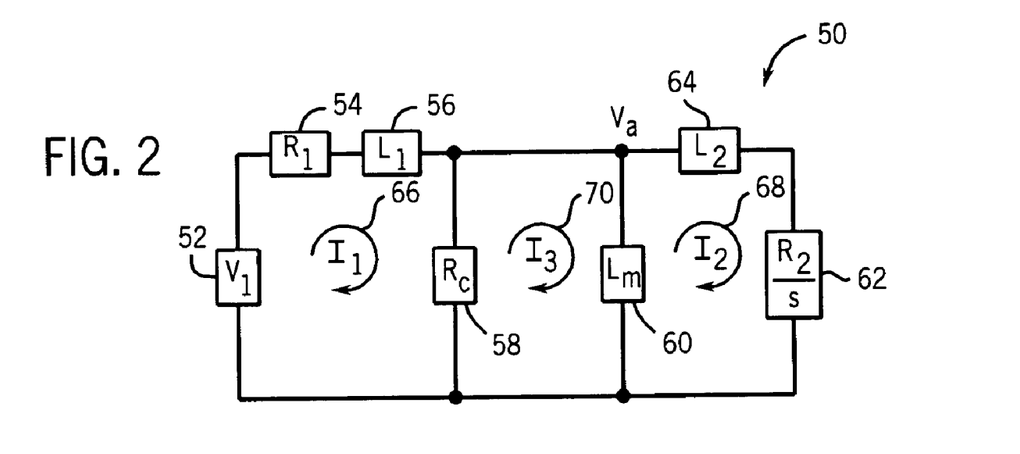
FIG. 2 is the single-phase steady state equivalent schematic circuit of an induction motor, according to an exemplary embodiment of the present invention.

Referring generally to FIG. 2, an equivalent circuit for steady state operation of the induction motor of FIG. 1 is shown and designated generally by the reference numeral 50. The induction motor is powered by an AC power source, designated by reference numeral 52, having a voltage amplitude $V_1$ and a frequency f. The stator of the motor has an electrical resistance $R_1$, as represented by reference numeral 54, and a leakage inductance $L_1$, as represented by reference numeral 56. The motor also has core loss resistance $R_c$ due to core losses in the stator and rotor, designated by the reference numeral 58. The motor also has a magnetizing inductance $L_m$, designated by reference numeral 60. The rotor also has a resistance, designated by reference numeral 62. As illustrated, the resistance is obtained by dividing the rotor resistance $R_2$ by the slip s of the rotor. Finally, the rotor also has a leakage inductance $L_2$, as represented by reference numeral 64. Electric current flows through the stator to produce the magnetic field. The electric current $I_1$ through the stator is represented by arrow 66. In addition, the magnetic field induces an electric current $I_2$ in the rotor, as represented by arrow 68. Finally, electric current flowing through the core loss resistance $R_c$ and the magnetizing inductance $L_m$ is represented by arrow 70.

In a typical AC circuit, the voltage and current vary over time. In an inductive circuit, such as an induction motor, the voltage leads the current by an angle, known as the phase angle $\phi$. In addition, some power is alternately stored and released by the inductance of the circuit. This power is known as the "reactive power." In addition, the resistance of the circuit dissipates power as heat and the load utilizes a portion of the input power, this power is known as the "real power." The "apparent power" is the product of the total voltage and the total current in the AC circuit. The ratio between the real power and the apparent power of a load in an AC circuit is known as the "power factor" of the load. The cosine of the phase angle is the power factor.

Figure 3:
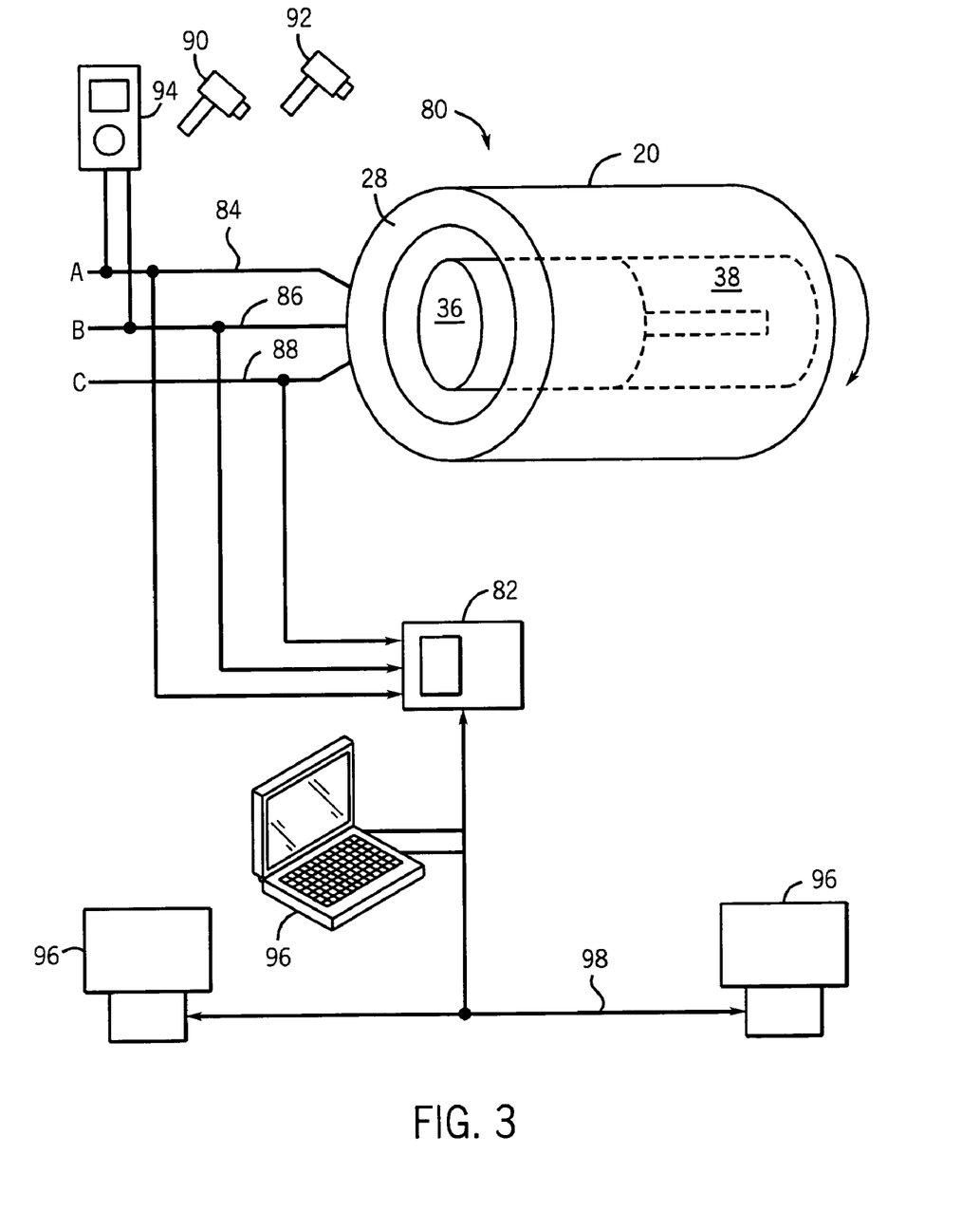
FIG. 3 is a system for establishing motor efficiency under balanced or unbalanced operating conditions, according to an exemplary embodiment of the present invention.

Referring generally to FIG. 3, a system for providing estimated values of various motor electrical parameters and motor operating parameters, such as the efficiency of the motor, under either balanced or unbalanced operating conditions, is shown and designated generally by reference numeral 80. The system 80 comprises a power monitoring module 82 that is electrically coupleable to each of the three phases of the stator: phase A, designated by reference numeral 84; phase B, designated by reference numeral 86; and phase C, designated by reference numeral 88. The power monitoring module 82 is operable to detect input voltage, current, frequency, and power. Current transformers may be used to detect the input current. Voltage transformers may be used to detect the input voltage. The power monitoring module 82 may be provided as a stand-alone device, as part of a motor, or in a kit form to be added to an existing installed motor.

The system 80 may comprise additional data gathering devices. For example, the illustrated embodiment of system 80 also comprises a non-contact thermometer 90 to enable the motor temperature to be measured and a strobe light 92 to enable the speed of the rotor to be measured. The illustrated system 80 also comprises an ohmmeter 94 to enable the stator resistance to be measured.

In the illustrated embodiment, the system comprises a computer 96 having a processor operable to process the data received by the power monitoring module 82 and the additional data gathering devices. Preferably, the computer 96 operates in accordance with programming instructions stored within the computer 96. The computer 96 may have analog-to-digital converters for converting analog data into digital data. In the illustrated embodiment, the computer 96 is operable to output data to additional computers 96 via a network 98. The computer 96 may be provided as a stand-alone device, as part of a motor, or in a kit form to be added to an existing installed motor.

The electrical input data may also be measured at the motor controller, rather than at the motor itself. However, in certain applications the motor controller may be quite remote from the motor. To facilitate the measurement of data at the motor, such as the rotor speed, and at other locations, such as at a motor controller, a time log of the measured voltages, currents, power and frequency may be used to record data. The voltages, currents, power and frequency corresponding to the time of the speed measurement are retrieved from the time log and matched to the speed of the rotor at that time. The effect on the electrical input data caused by taking the measurement at the motor controller may also be compensated for. First, the length of the cable between the motor and the starter may be measured. In addition, the ambient temperature is measured and the gauge of the cable identified. The diameter of the conductor may be calculated from the gauge of the cable. The resistance of the cable may be estimated based on the operating temperature, the length and diameter of the cable. The cable resistance is then subtracted from the total measured resistance to establish the stator resistance. Furthermore, the power loss in the cable may be established from the measured current and estimated cable resistance. The cable power is then subtracted from the measured power to obtain the power delivered to the motor.

Figure 4:
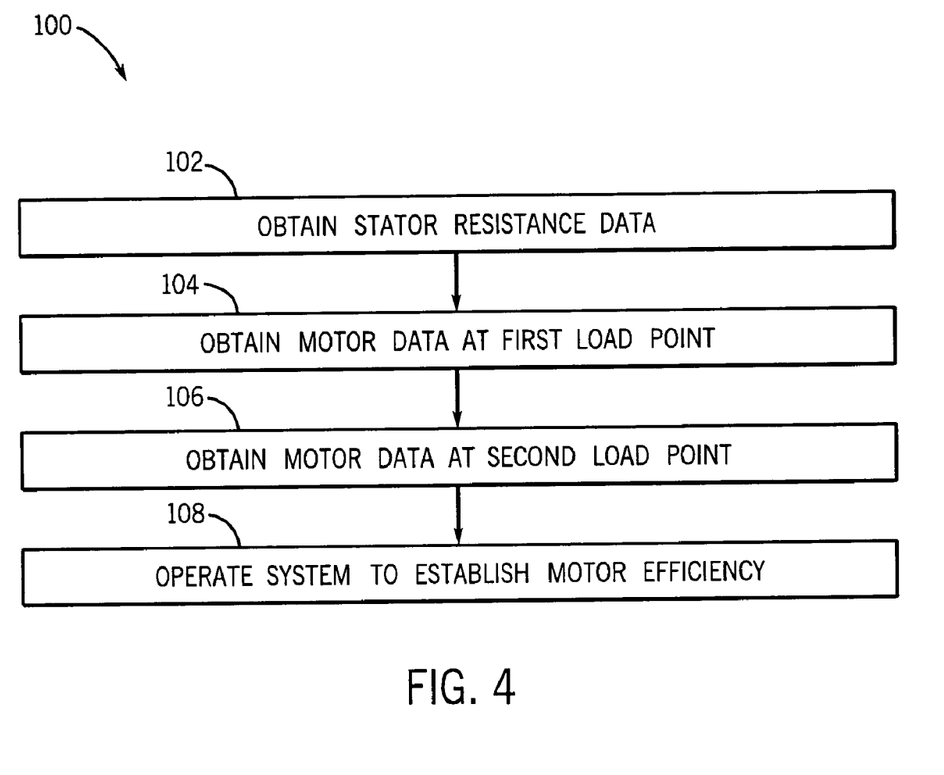
FIGS. 4 and 5 are block diagrams of a method for establishing the efficiency of a motor operated under balanced or unbalanced conditions, according to an exemplary embodiment of the present invention.

Referring generally to FIG. 4, a process for establishing values of various motor electrical parameters and various motor operating parameters under balanced or unbalanced operating conditions using the system of FIG. 3 is shown and designated generally by reference numeral 100. The process comprises obtaining the resistance of the stator, as represented by block 102. The stator resistance may be obtained using the ohmmeter 94. The process also comprises obtaining data at a first operating load point and providing the data to the computer 96, as represented by block 104. In a presently contemplated embodiment, the data obtained at the first load point comprises: input voltage data, input current data, input power data, shaft speed data, and stator temperature data. The input voltage data and input current data are obtained using the power monitoring module 82. The input power may also be obtained using the power monitoring module 82. The shaft speed data is obtained using the strobe light 92. However, the shaft speed data may be obtained from an installed measuring device. The temperature of the stator is obtained using the temperature sensor 90.

The process also comprises obtaining data from the motor at a second load point and providing the data to the computer 96, as represented by block 106. In a presently contemplated embodiment, the data obtained at the second load point comprises: input voltage data, input current data, input power data, shaft speed data, and stator temperature data. Preferably, the motor has a full load at the second load point. As before, the input voltage data and input current data are obtained using the power monitoring module 82 and the shaft speed data is obtained using the strobe light 92. The stator resistance $R_1$ data need only be obtained once if the stator temperature is obtained at each load point. An increase in the stator temperature will produce an increase in the stator resistance. The measured values of the stator temperature may be used to increase the value of the stator resistance measured initially to reflect the increase in the stator resistance caused by heating.

The computer 96 is then operated to establish values of various motor electrical parameters and various motor operating parameters, such as the efficiency of the motor, under balanced or unbalanced operating conditions, as represented by block 108. The programming instructions provided to the computer 96 are adapted to utilize a novel technique for establishing the values of the various motor parameters under either balanced or unbalanced operating conditions.

Figure 5:
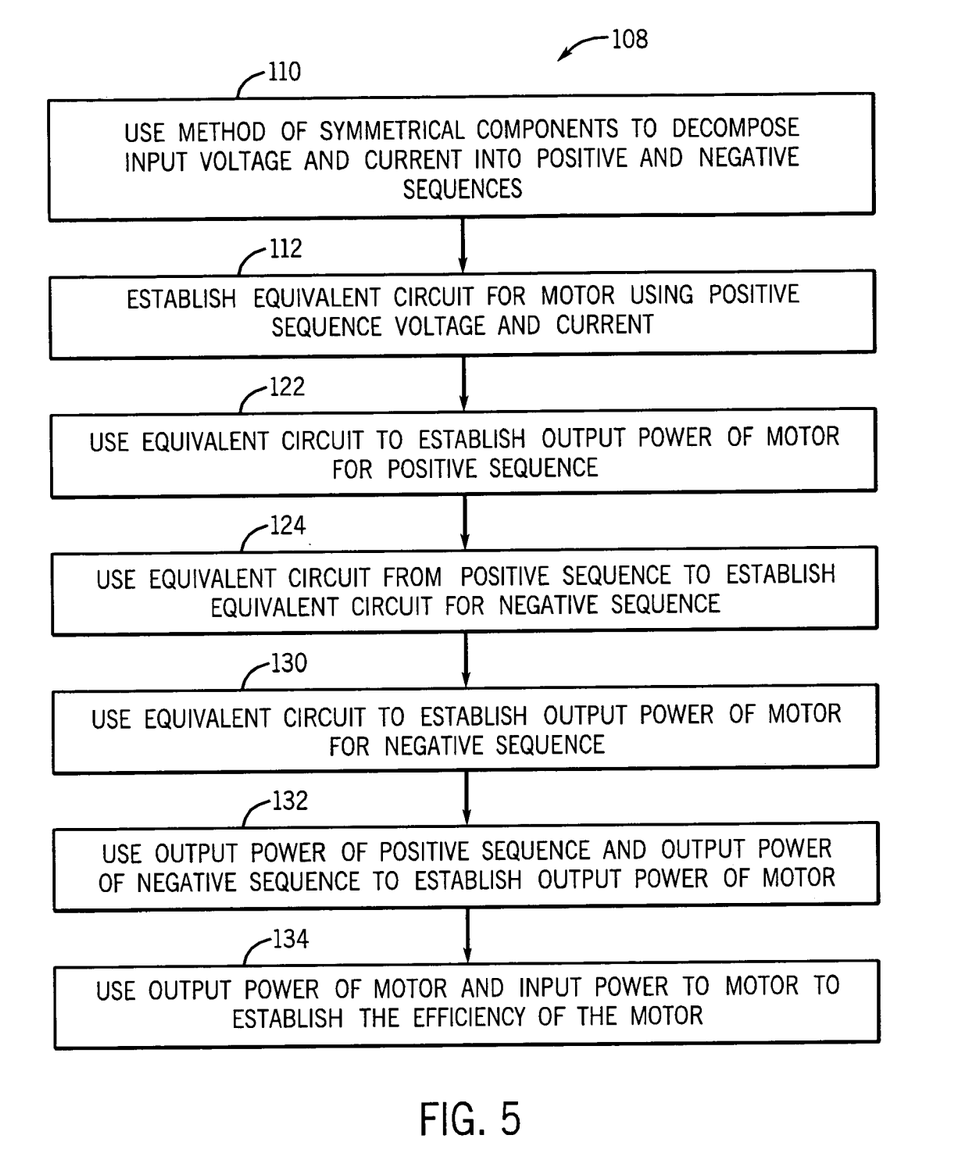

Referring generally to FIG. 5, a more detailed block diagram of the process of establishing values of various motor electrical parameters and various motor operating parameters under balanced or unbalanced operating conditions, as represented by block 108 of FIG. 4, is illustrated. In the illustrated embodiment, the computer 96 is programmed to utilize the method of symmetrical components to decompose the input voltage and current into a balanced set of phasors with a positive sequence and a balanced set of phasors with a negative sequence, as represented by block 110. The method of symmetrical components has been used to analyze the steady state behavior of power system apparatus during unbalanced operation. However, the method of symmetrical components can also be used to analyze the steady state behavior of power system apparatus during balanced operation.

The input voltage and current to the multiphase motor may be represented as sets of phasors, each phasor representing one of the phases of the input power. For example, a set of phasors representing input voltage to a multiphase motor may have a phasor representing a first phase, a phasor representing a second phase, and a phasor representing a third phase of the input power to the motor. In a balanced condition, each phasor has the same magnitude and differs by an angle of 120 degrees. However, in an unbalanced condition, the magnitude of one or more of the phasors differs from the magnitude of the other phasors. In addition, the angles between the phasors may differ.

The method of symmetrical components enables the sets of phasors representing an unbalanced three-phase input power to be expressed in terms of: (1) a balanced set of phasors with an ABC sequence (the positive sequence); (2) a balanced set of phasors with an ACB sequence (the negative sequence); and (3) a set of three equal phasors (the zero sequence). The magnitude of each of the phasors in the positive sequence is the same, as are the phasors in the negative sequence. This greatly simplifies analysis of the motor electrical parameters and operating parameters. The input voltage and the input current may each be represented by a balanced set of phasors with a positive sequence and a balanced set of phasors with a negative sequence.

Figure 6:
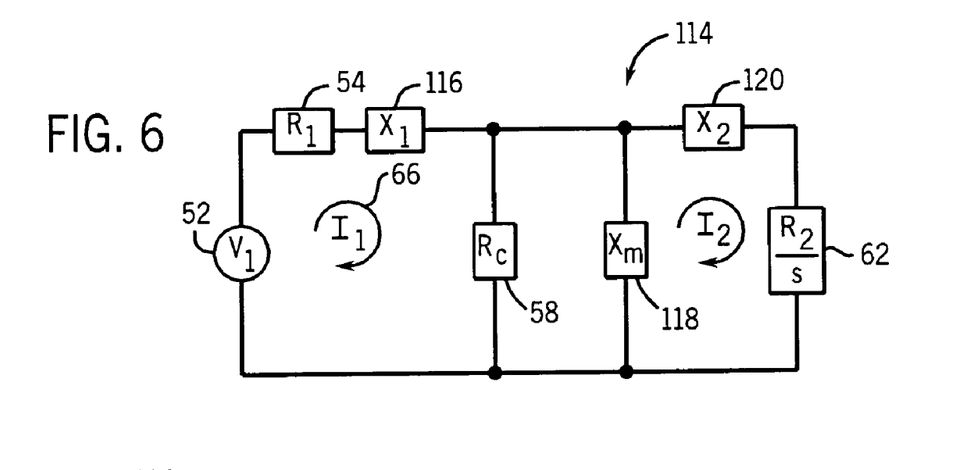
FIG. 6 is an equivalent circuit to the single-phase steady state schematic circuit of FIG. 2 for a positive sequence of a multiphase electrical input to the motor, according to an exemplary embodiment of the present invention.

The positive sequence generally represents an initial balanced operating condition and the negative sequence generally represents the degree of deviation from the initial balanced operating state, such that when the two sequences are combined they represent the actual input to the motor. Thus, the magnitude of the negative sequence increases as the input voltage becomes more and more unbalanced. As is well known to those skilled in the art, once the unbalanced stator voltages are known, the method of symmetrical components can be used to establish the positive sequence voltage, as well as the negative sequence voltage. Similarly, the input currents can be decomposed into a set of positive and negative sequence currents In the illustrated embodiment, the balanced sets of phasors with a positive sequence are used to establish an equivalent circuit for the motor, as represented by block 112. Referring generally to FIG. 6, an example of an equivalent circuit, designated generally by reference numeral 114, to the circuit of FIG. 2 is illustrated. However, other equivalent circuits may be used to represent the motor. For example, various electrical parameters may be combined, either in parallel or in series.

The input voltage to the positive sequence equivalent circuit is designated $V_{1p}$. In FIG. 6, each inductance illustrated in FIG. 2 has been converted into an inductive reactance to facilitate solving for the unknown motor parameters. In addition, some of the reactances are combined to simplify the equivalent circuit 114. The stator leakage reactance $X_1$, designated by reference numeral 116, is a function of the electrical frequency f of the power source and the stator leakage inductance $L_1$. The magnetizing reactance $X_m$, designated by reference numeral 118, is a function of the electrical frequency f and the magnetizing inductance $L_m$. The rotor leakage reactance $X_2$, designated by reference numeral 120, is a function of the electrical frequency f and the rotor leakage inductance $L_2$. Of the parameters illustrated in FIG. 6, the stator resistance $R_1$ and the motor slip s can be measured relatively easily. This leaves the values of five parameters to be established: $X_1$, $R_2$, $X_2$, $R_c$, and $X_m$. These parameters are more difficult to measure than the stator resistance $R_1$ and the motor slip s.

The following procedure enables the values of $X_1$, $R_2$, $X_2$, $R_c$, and $X_m$ to be estimated based on the positive sequence data. Several assumptions and an approximation are made to simplify the process of estimating $X_1$, $R_2$, $X_2$, $R_c$, and $X_m$. Namely, it is assumed that the frequency of the power is constant, that the speed of the rotor does not change during the gathering of the load point data, and that the reading of the data is done quickly so that the rotor temperature is constant during the gathering of the data. Additionally, it has been established experimentally that excellent results are obtained by estimating the stator leakage reactance $X_1$ to be 5% of the magnetizing reactance $X_m$, or:

$$X_1 = 0.05 X_m. \tag{1}$$

However, this factor may range from 0.02 to 0.07. By making this approximation the number of unknowns is reduced to four. Thus, only four equations are needed to solve for the values of the remaining unknown motor parameters. However, the equations relating these unknowns are highly nonlinear and an expression for the remaining unknowns by using measurements obtained at two load points is nontrivial. In the present technique, this process is facilitated by obtaining an actual value for the stator leakage reactance $X_1$. This value is then used in finding the values of the remaining unknowns.

In addition, the rotor leakage inductance $L_2$ and magnetizing inductance $L_m$ are converted into reactances in FIG. 6 to assist in solving the various unknown motor parameters. Reactance is a function of the inductance and the frequency f of the circuit. The reactances were combined with the rotor resistance $R_2$ and the core loss resistance $R_c$ to form an equivalent reactance $X_e$ and a total resistance $R_t$. At a first load point, the total resistance $R_{t1}$ is given by the following equation:

$$\frac{1}{R_{t1}} = \frac{1}{R_c} + \frac{1}{\left(\frac{R_2}{s_1} + \frac{s_1 X_2^2}{R_2}\right)}. \tag{2}$$

The first term on the right side of the equation is the reciprocal of the core loss resistance $R_c$ and the second term is the reciprocal of the new modified rotor resistance as a result of decomposing the rotor leakage reactance $X_2$. At the second load point, the total resistance $R_{t2}$ is given by the following equation:

$$\frac{1}{R_{t2}} = \frac{1}{R_c} + \frac{1}{\left(\frac{R_2}{s_2} + \frac{s_2 X_2^2}{R_2}\right)}. \tag{3}$$

Similarly, the equivalent reactances at the two motor load points $X_{e1}$ and $X_{e2}$ are given by the following equations:

$$\frac{1}{X_{e1}} = \frac{1}{X_m} + \frac{X_2}{\left(\frac{R_2^2}{s_1^2} + X_2^2\right)}; \text{ and} \quad (4)$$

$$\frac{1}{X_{e2}} = \frac{1}{X_m} + \frac{X_2}{\left(\frac{R_2^2}{s_2^2} + X_2^2\right)}. \quad (5)$$

The right hand sides of equations (4) and (5) also have two terms, one resulting from the magnetizing reactance $X_m$ and the other resulting from decomposing the rotor leakage reactance $X_2$.

The equation for the equivalent reactance $X_e$ is given as follows:

$$X_e = \frac{-B}{2A} + \frac{\sqrt{B^2 - 4AC}}{2A}, \quad (6)$$

where A, B, and C are given by:

$$A = 1.05 * 0.05 * sI_1^2; \quad (7)$$

$$B = -1.1 I_1 V_1 s; \text{ and} \quad (8)$$

$$C = V_{1i}^2 s + (sR_1 I_1 - sV_{1R})(I_1 R_1 - V_{1R}). \quad (9)$$

$V_{1i}$ is the imaginary portion of the voltage and is a function of the amplitude of the power source voltage $V_1$ and the sine of the power factor angle. $V_{1R}$ is the real portion of the voltage and is a function of the amplitude of the power source voltage $V_1$ and the cosine of the phase angle. In addition, the equivalent resistance $R_e$ is given by the following equation:

$$R_e = \frac{sX_e(V_{1j} - 0.5I_1 X_e)}{(V_{1R} - I_1 R_1)}. \quad (10)$$

As discussed above, it was assumed that the stator leakage reactance is 5%, or 0.05 of the magnetizing reactance $X_m$. With no load on the motor, the rotor section of the circuit is considered open and the value for the slip s is considered to be zero. The total reactance of the circuit is made of the sum of the stator leakage reactance $X_1$ and the magnetizing reactance $X_m$. Since $X_1$ can be expressed as equal to 0.05 $X_m$, then the total no-load reactance can be written as 1.05 $X_m$. The value of $X_e$ at the two load points is used to extrapolate the value at no-load to yield $X_m$. The value of $X_e$ at zero-load is the magnetizing reactance $X_m$. In addition, the slip s is used as a measure of the load. Through experimentation using different load points and different motors, it has been found that the following equation yields a very close value for the magnetizing reactance $X_{mi}$ to be used for estimating the stator leakage reactance $X_1$:

$$X_{mi} = X_{e1} + \frac{(X_{e2} - X_{e1})s_1^{\frac{1}{4}}}{(s_1 - s_2)^{\frac{1}{4}}}. \quad (11)$$

In equation (11) above, $s_1$ is the slip at a high load and $s_2$ is the slip at a low load, noting that $s_1$ is greater than $s_2$. The value of $X_{mi}$ may then be used to establish the value of $X_1$, in accordance with equation (1) provided above.

Once the value of $X_1$ is obtained, new values for $R_t$ and $X_e$ may be obtained. These new values of $R_t$ and $X_e$ are based on a fixed known value of the stator reactance $X_1$, and may be determined in accordance with the following equations:

$$\alpha_1 = \frac{1}{R_{t1}} - \frac{1}{R_{t2}}; \text{ and} \quad (12)$$

$$\alpha_2 = \frac{1}{X_{e1}} - \frac{1}{X_{e2}}. \quad (13)$$

There now are four equations and four unknowns. The unknowns are $R_2$, $X_2$, $R_c$, and $X_m$. To eliminate $R_c$, equation (3) is subtracted from equation (2) to yield the following equation:

$$\alpha_1 = \frac{\frac{R_2}{s_1}\left(\frac{R_2^2}{s_2^2} + X_2^2\right) - \frac{R_2}{s_2}\left(\frac{R_2^2}{s_1^2} + X_2^2\right)}{\left(\frac{R_2^2}{s_1^2} + X_2^2\right)\left(\frac{R_2^2}{s_2^2} + X_2^2\right)}. \quad (14)$$

To eliminate $X_m$, equation (5) is subtracted from equation (4) yielding the following equation:

$$\alpha_2 = \frac{X_2\left(\frac{R_2^2}{s_2^2} + X_2^2\right) - X_2\left(\frac{R_2^2}{s_1^2} + X_2^2\right)}{\left(\frac{R_2^2}{s_1^2} + X_2^2\right)\left(\frac{R_2^2}{s_2^2} + X_2^2\right)}. \quad (15)$$

From the equations provided above, equations may now be established for $R_2$, $X_2$, $R_c$, and $X_m$. By dividing equation (14) by equation (15), the following relationship for the $X_2$ and $R_2$ can be established:

$$X_2 = \gamma R_2. \quad (16)$$

where $\gamma$ is given by the following equation:

$$\gamma = \frac{-\alpha_1(s_1 + s_2)}{2\alpha_2 s_1 s_2} + \frac{\sqrt{\left(\frac{\alpha_1}{\alpha_2}\right)^2(s_1 + s_2)^2 + 4s_1 s_2}}{2s_1 s_2}. \quad (17)$$

The rotor resistance $R_2$ may be established by substituting $\gamma R_2$ for $X_2$ in equation (15) and using algebraic manipulation to produce the following equation:

$$R_2 = \frac{\frac{\gamma}{a_2}}{\left(\frac{1}{s_1^2 + \gamma^2}\right)} - \frac{\frac{\gamma}{a_2}}{\left(\frac{1}{s_2^2 + \gamma^2}\right)}. \quad (18)$$

In addition, the core loss resistance $R_c$ may be established in terms of $R_2$ and $X_2$ by manipulating equation (2) to produce the following equation:

$$R_c = \frac{1}{\left(\frac{1}{R_{t1}} - \frac{\frac{R_2}{s_1}}{\left(\frac{R_2^2}{s_1^2} + X_2^2\right)}\right)} \quad (19)$$

Finally, the magnetizing reactance $X_m$ may be established in terms of $R_2$ and $X_2$ by manipulating equation (4) to produce the following equation:

$$X_m = \frac{1}{\left(\frac{1}{X_{e1}} - \frac{X_2}{\left(\frac{R_2^2}{s_1^2} + X_2^2\right)}\right)}. \quad (20)$$

The computer 96 is programmed to use the above-described equations and methodology to establish estimated values of rotor resistance $R_2$, leakage reactance $X_2$, core loss resistance $R_c$ and magnetizing reactance $X_m$ based on the positive sequence data obtained at the two load points. In addition, motor speed data also is provided to the computer 96. The motor speed data may be the RPM of the motor or the slip. Ideally, the measurements at the two load points are made with a very short time separation to avoid potential change due to a change in the operating condition of the motor. In addition, in the illustrated embodiment the line-to-line electrical resistance of the stator is provided to the processor. The phase resistance is established by averaging the line-to-line resistance and dividing by 2.

In the illustrated embodiment, the computer 96 is operable to establish the value of the equivalent reactances $X_{e1}$ and $X_{e2}$ using equations (6) through (10) provided above at each load point. The processor also is operable to establish the initial magnetizing reactance $X_{mi}$ using equation (11) provided above. In addition, the processor is operable to establish the value of the phase leakage reactance $X_1$ from the magnetizing reactance $X_{mi}$. Using the value of $X_1$, the computer 96 is operable to find new values for the equivalent resistances $R_{t1}$, $R_{t2}$, $R_{e1}$, and $X_{e2}$, where:

$$R_{t1} = \frac{R_{e1}}{s_1}; \text{ and} \quad (21)$$

$$R_{t2} = \frac{R_{e2}}{s_2}. \quad (22)$$

Referring again to FIG. 5, the computer 96 is operable to establish the motor output power due to the positive sequence based on the values of $X_1$, $R_2$, $X_2$, $R_c$, and $X_m$ established above, as represented by block 122. In the illustrated embodiment, the computer 96 is operable to establish the values of the rotor torque T, the rotor temperature, and the output power of the motor for the positive sequence based on the values of $R_2$, $X_2$, $R_c$, and $X_m$, the positive sequence electrical input data and rotor speed data. The rotor current $I_2$ for the positive sequence may be established using the following equation:

$$I_2 = \left(I_1 - \frac{(V_{1R} - I_1 R_1)}{R_c} - \frac{(V_{1i} - I_1 X_1)}{X_m}\right) + \quad (23)$$
$$j\left(\frac{(V_{1R} - I_1 R_1)}{X_m} - \frac{(V_{1i} - I_1 X_1)}{R_c}\right).$$

The shaft torque for the positive sequence may be obtained from the rotor resistance $R_2$ and the rotor current $I_2$, as follows:

$$T(N\text{-}m) = \frac{3 I_2^2 R_2}{\omega_s s}. \quad (24)$$

In the above equation, $I_2$ is the rotor current $I_2$, and $\omega_s$ is the mechanical synchronous speed in rad/second given by:

$$\omega_s = \frac{4\pi f}{p}. \quad (25)$$

In this equation, f is the alternating current frequency in Hz and p is the number of poles of the motor.

The shaft torque may be converted to foot-pounds by multiplying the torque in Newton-meters by 0.738. In addition, the shaft torque is modified by subtracting the friction and the windage loss $W_{F\&W}$ and the stray load loss using published values and IEEE standards, as shown in the following table:

| Motor Power | SLL % of output power |
| --- | --- |
| 1–125 HP | 1.8 |
| 126–500 HP | 1.5 |
| 501–2499 HP | 1.2 |

The estimated output mechanical power $P_{out}$ for the positive sequence may be established from the torque T and the rotor speed data.

Figure 7:
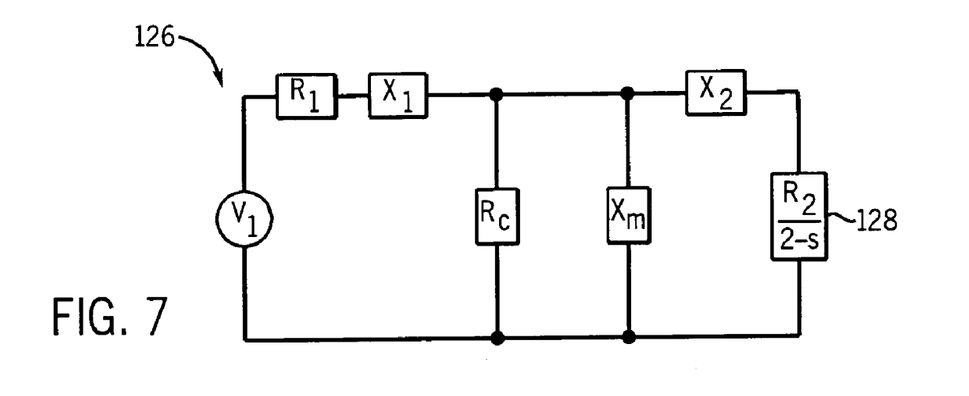
FIG. 7 is an equivalent circuit to the single-phase steady state schematic circuit of FIG. 2 for a negative sequence of the multiphase electrical input to the motor, according to an exemplary embodiment of the present invention.

Referring again to FIG. 5, the computer 96 is operable to use the circuit values obtained from the positive sequence data to produce an equivalent circuit for the negative sequence, as represented by block 124. Referring generally to FIG. 7, an equivalent circuit 126 for the negative sequence is illustrated. The input voltage to the negative sequence equivalent circuit is designated $V_{In}$. The slip s is the normalized difference between the speed of the rotating air-gap magneto motive force (MMF) and the rotor speed. If the positive sequence currents produce a MMF that urges the rotor to rotate in a counter-clockwise direction, then the negative sequence currents produce a MMF that urges the rotor to rotate in the clockwise direction. Hence, the normalized difference between the MMF and the rotor speed can be written as (2-s). In the equivalent circuit 126 for the negative sequence, the resistance of the rotor, designated by reference numeral 128, is obtained by dividing the rotor resistance $R_2$ by (2-s).

The computer 96 also is operable to use the techniques described above to establish the output power of the motor for the negative sequence, as represented by block 130. The technique may also establish the torque of the motor, and other motor operating parameters from the negative sequence.

The computer 96 also is operable to establish the output power of the motor based on the values of the output power derived from the positive sequence and the negative sequence, as represented by block 132. Because the positive sequence currents urge the rotor to rotate in a one direction and the negative sequence currents urge the rotor to rotate in the opposite direction, the output power of the motor is the difference in the magnitude of the output power produced by the positive sequence and the magnitude of the output power produced by the negative sequence.

The computer 96 also is operable to establish the efficiency of the motor, as represented by block 134. In the illustrated embodiment, the computer 96 divides the motor output power by the electrical input power to establish the efficiency of the motor.

$$\eta = \frac{P_{out}}{P_{in}}. \quad (26)$$

The techniques provided above enable the efficiency of the motor, and other operating parameters, to be established under balanced conditions, as well as unbalanced conditions. As the motor approaches operation in a balanced condition, the magnitude of the balanced set of phasors with the negative sequence decreases. Ultimately, when the motor is operated in a balanced condition, the output power produced by the negative sequence is zero and the positive sequence produces the output power of the motor.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system for establishing at least one operating parameter of a multiphase motor, comprising:
   programming instructions stored in a tangible medium; and
   a processor operable to receive data and to process the data in response to the programming instructions,
   wherein the processor is operable to receive multiphase motor electrical input data and represent the multiphase motor electrical input data as a balanced set of phasors with a positive sequence and a balanced set of phasors with a negative sequence,
   further wherein the processor is operable to establish motor output power based on the balanced set of phasors with a positive sequence and the balanced set of phasors with a negative sequence, and based on measurements taken from the motor while coupled to a load, wherein the measurements taken from the motor while in a coupled state are the only measurements taken from the motor to establish the motor output power.

2. The system as recited in claim 1, wherein the processor establishes a positive sequence motor output power based on the balanced set of phasors with a positive sequence and a negative sequence motor output power based on the balanced set of phasors with a negative sequence.

3. The system as recited in claim 1, wherein the motor output power is the difference of the positive sequence motor output power and the negative sequence motor output power.

4. The system as recited in claim 3, wherein the processor is operable to establish the efficiency of the motor based on the motor output power and electrical input power.

5. The system as recited in claim 1, wherein the multiphase motor electrical input data comprises input voltage, input current, and input power.

6. The system as recited in claim 5, wherein the input power is established from the input voltage and the input current.

7. The system as recited in claim 5, wherein the balanced set of phasors with a positive sequence comprises a balanced set of phasors with a positive sequence representing input current and a balanced set of phasors with a positive sequence representing input voltage.

8. The system as recited in claim 1, wherein the processor is operable to establish a plurality of motor electrical characteristic parameters based on the balanced set of phasors with a positive sequence, rotor speed data, stator resistance data, and stator temperature data.

9. The system as recited in claim 8, wherein the plurality of motor electrical characteristic parameters comprises electrical resistance of the rotor during operation of the motor.

10. The system as recited in claim 8, wherein the plurality of motor electrical characteristic parameters comprises stator inductance.

11. The system as recited in claim 8, wherein the processor is operable to establish a plurality of motor operating parameters based on the plurality of motor electrical characteristic parameters, the plurality of motor operating parameters comprising electrical current induced in the rotor.

12. The system as recited in claim 8, wherein the processor is operable to establish the plurality of motor electrical characteristic parameters based on data obtained at a plurality of different load conditions of the motor, the data comprising the balanced set of phasors with a positive sequence, rotor speed data, and stator temperature.

13. The system as recited in claim 8, comprising a first device operable to detect motor input voltage, motor input current, and input frequency.

14. The system as recited in claim 8, comprising a second device operable to detect the stator resistance.

15. The system as recited in claim 8, comprising a third device operable to detect the rotor speed.

16. The system as recited in claim 8, comprising a fourth device operable to detect the motor temperature.

17. A method of analyzing multiphase motor operation, comprising:
   obtaining stator electrical input data during operation of the motor;
   decomposing the stator electrical input data into a balanced set of phasors with a positive sequence and a balanced set of phasors with a negative sequence; and
   establishing the efficiency of the multiphase motor based on the balanced set of phasors with a positive sequence and the balanced set of phasors with a negative sequence, and based on measurements taken from the motor while coupled to a load, wherein the measurements taken from the motor while in a coupled state are the only measurements taken from the motor to establish the efficiency of the motor.

18. The method as recited in claim 17, wherein decomposing the stator electrical input data comprises decomposing stator input voltage data into a balanced set of voltage phasors with a positive sequence and a balanced set of voltage phasors with a negative sequence.

19. The method as recited in claim 17, wherein decomposing the stator electrical input data comprises decomposing stator input current data into a balanced set of current phasors with a positive sequence and a balanced set of current phasors with a negative sequence.

20. The method as recited in claim 17, wherein establishing the efficiency of the multiphase motor comprises establishing a plurality of motor electrical parameters based on the balanced set of phasors with a positive sequence.

21. The method as recited in claim 20, wherein establishing the efficiency of the multiphase motor comprises establishing an output power of the motor.

22. The method as recited in claim 21, wherein an output power of the motor comprises establishing a first motor output power based on the positive sequence and the motor electrical parameters and a second motor output power based on the negative sequence and the motor electrical parameters, the output power being the difference of the first and second motor output powers.

23. The method as recited in claim 20, wherein the motor electrical parameters comprise rotor resistance.

24. The method as recited in claim 20, wherein the motor electrical parameters comprise magnetizing reactance.

25. The method as recited in claim 20, wherein the motor electrical parameters comprise core loss resistance.

26. The method as recited in claim 20, wherein the motor electrical parameters comprise rotor leakage reactance.

27. A system, comprising:
means for obtaining multiphase electrical input data;
means for decomposing the multiphase electrical input data into a positive sequence and a negative sequence;
means for establishing motor electrical parameters based on the positive sequence; and
means for establishing a first output of the motor based on the motor electrical parameters, the positive sequence, and measurements taken from the motor while coupled to a load, wherein the measurements taken from the motor while in a coupled state are the only measurements taken from the motor to establish the first output of the motor.

28. The system as recited in claim 27, comprising means for establishing a second output of the motor based on the motor electrical parameters and the negative sequence.

29. The system as recited in claim 27, comprising means for establishing the efficiency of the motor based on the motor electrical parameters, the positive sequence, and negative sequence.

30. A computer program product, comprising:
one or more computer-readable media having programming instructions stored thereon, wherein the programming instructions enable a processor to decompose multiphase electrical data into a positive sequence and a negative sequence, to establish the efficiency of the motor based on the positive and negative sequences, and to output and/or store the established efficiency of the motor to enable a user to analyze the motor based on the established efficiency, wherein the established efficiency is based on measurements taken from the motor while coupled to a load, and wherein the measurements taken from the motor while in a coupled state are the only measurements taken from the motor to establish the efficiency of the motor.

31. The computer program product as recited in claim 30, wherein the programming instructions utilize the method of symmetrical components to decompose the multiphase electrical data.

32. The computer program product as recited in claim 30, wherein the programming instructions enable the processor to establish a plurality of motor electrical parameters based on positive sequence and rotor speed data obtained at a plurality of load points, and stator resistance.

33. The computer program product as recited in claim 32, wherein the programming instructions enable the processor to establish a motor output, the motor output comprising a first motor output based on the plurality of motor electrical parameters and the positive sequence and a second motor output based on the plurality of motor electrical parameters and the negative sequence.

34. A computer program product, comprising:
one or more computer-readable media having programming instructions stored thereon, wherein the programming instructions enable a processor to decompose multiphase electrical data into a positive sequence and a negative sequence, to establish at least one motor electrical characteristic based on the positive sequence, to establish a positive sequence motor output power based on the at least one motor electrical characteristic, the positive sequence, and measurements taken from the motor while coupled to a load, and to output and/or store the established positve sequence motor output power to enable a user to analyze the motor based on the established positive sequence motor output power, wherein the established positive sequence motor output power is based on measurements taken from the motor while coupled to a load, and wherein the measurements taken from the motor while in a coupled state are the only measurements taken from the motor to establish the positive sequence motor output power.

35. The computer program product as recited in claim 34, wherein the programming instructions en able a processor to establish a negative sequence motor output power based on the at least one motor electrical characteristic and the negative sequence.

36. The computer program product as recited in claim 35, wherein the programming instructions enable a processor to establish motor efficiency based on the positive sequence motor output power and the negative sequence motor output power.

* * * * *